US012765418B2

(12) United States Patent
Liu et al.

(10) Patent No.: US 12,765,418 B2
(45) Date of Patent: Oct. 13, 2026

(54) METHOD FOR PANEL-LEVEL THERMO-COMPRESSION BONDING

(71) Applicant: Intel Corporation, Santa Clara, CA (US)

(72) Inventors: Minglu Liu, Chandler, AZ (US); Andrey Gunawan, Paradise Valley, AZ (US); Gang Duan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 789 days.

(21) Appl. No.: 18/060,617

(22) Filed: Dec. 1, 2022

(65) Prior Publication Data

US 2024/0186281 A1 Jun. 6, 2024

(51) Int. Cl.
*H10W 90/00* (2026.01)
*H10W 72/00* (2026.01)

(52) U.S. Cl.
CPC ........ *H10W 90/00* (2026.01); *H10W 72/0198* (2026.01); *H10W 72/0711* (2026.01); *H10W 72/07113* (2026.01); *H10W 72/07141* (2026.01); *H10W 72/07173* (2026.01); *H10W 72/07178* (2026.01); *H10W 72/072* (2026.01); *H10W 72/07231* (2026.01); *H10W 72/07232* (2026.01); *H10W 72/07236* (2026.01)

(58) Field of Classification Search
None
See application file for complete search history.

(56) References Cited

U.S. PATENT DOCUMENTS 9,911,710 B2 * 3/2018 Celia, Jr. ............ B23K 37/0408
11,011,499 B2 * 5/2021 Hotta ........................ H01L 24/32
2015/0016083 A1 * 1/2015 Nootens .................... H05B 3/26 29/611
2022/0216256 A1 * 7/2022 Wu ........................ H10F 39/018
2023/0317675 A1 * 10/2023 Baker ...................... H01L 24/81 438/125
2023/0317676 A1 * 10/2023 Baker ...................... H01L 24/81 228/193

FOREIGN PATENT DOCUMENTS

WO WO-2015038074 A1 * 3/2015 ............. H01L 24/81

* cited by examiner

*Primary Examiner* — Devang R Patel
(74) *Attorney, Agent, or Firm* — Viering, Jentschura & Partner mbB

(57) ABSTRACT

The present disclosure is directed to a thermocompression bonding tool having a bond head with a surface for compression and heating and a sensor, a stage for compression and heating, and a controller, and a method for its use for chip gap height and alignment control. For chip gap height and alignment control, the controller is provided with a recipe displacement and temperature profile and measured offsets.

12 Claims, 5 Drawing Sheets

METHOD FOR PANEL-LEVEL THERMO-COMPRESSION BONDING

BACKGROUND

For integrated circuit design and fabrication, the need to improve performance and lower costs are constant challenges. Cost savings may be potentially realized by building dies on semiconductor panels rather than semiconductor wafers. By using a rectangular panel as a carrier, panel-level fan-out technology, which uses a molded embedded design, offers the potential for lower production cost due to a higher area utilization ratio of the carrier and better economical manufacturing, especially for large packages.

Presently, there are efforts to develop panel-level packaging technology that will follow a roadmap that will lead to increasingly larger panels, e.g., 500 mm by 500 mm panels and larger. However, there may be physical constraints in panel-level packaging that may hinder the use of larger panels, such as panel warpage, and the handling capability of processing tools, which may render processing operations extremely difficult to control and may result in low yields.

An important process that is used in multiple steps during semiconductor fabrication involves thermocompression bonding, which consists of heating and applying thermal and mechanical pressure to join two components or bodies. The bonding tools that are used are typically fully automated, i.e., the automated loading and unloading of bond chucks/stages and the automated processing in the amount of applied heat and force on the components. It is critically important to have thermocompression bonding tools for panel-level packaging that are properly characterized and used the correct inputs for the assembly processes to achieve the chip gap heights and chip alignment as set forth in the production design.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

Figures 1, 1A:
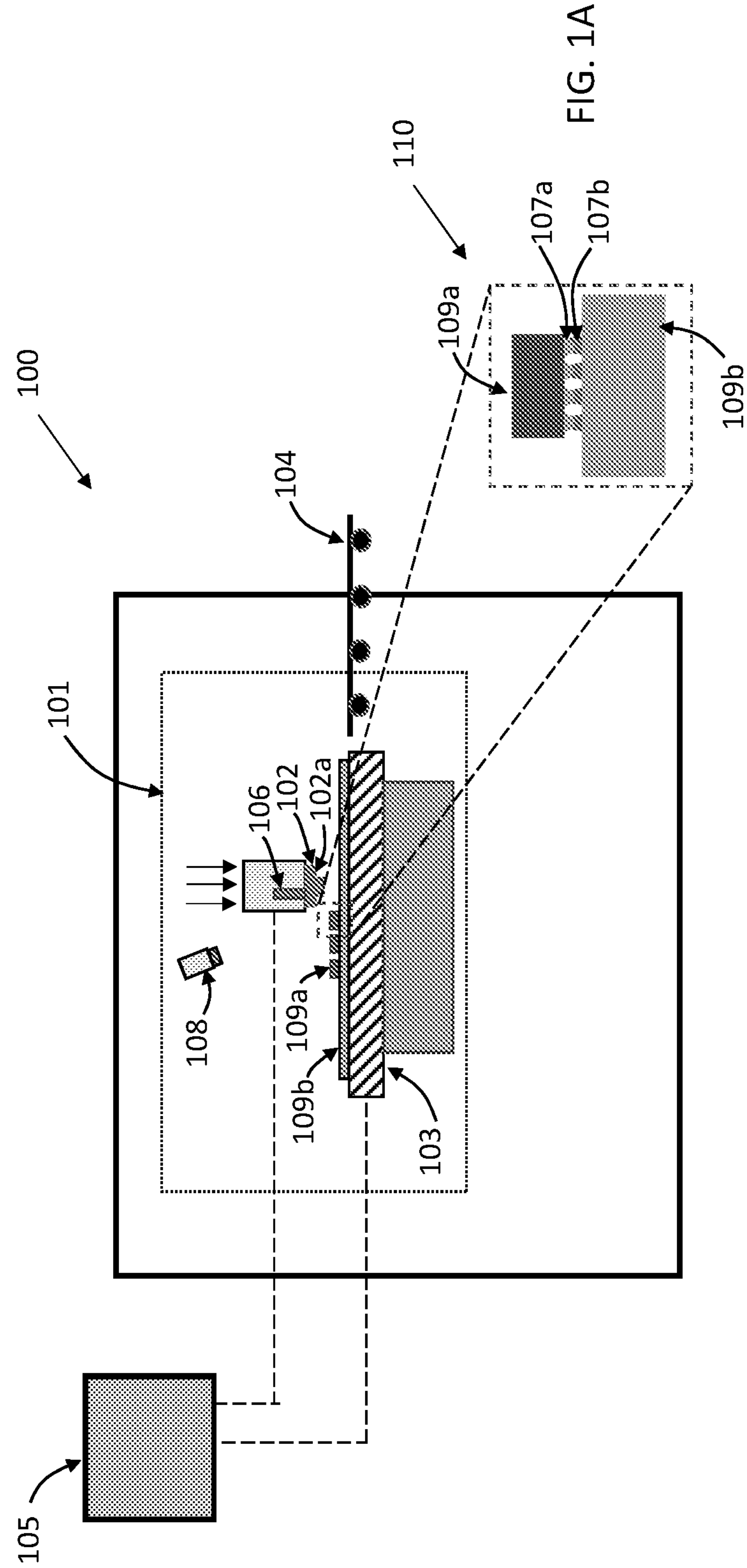
FIG. 1 shows an exemplary representation of a thermocompression bonding tool and FIG. 1A shows a semiconductor package bonded to a semiconductor panel according to an aspect of the present disclosure.

The following detailed description refers to the accompanying drawings that show, by way of illustration, specific details, and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

A high degree of accuracy (e.g., <1 μm) in x, y, z, and theta (rotational) placements may be required for panel-level thermocompression bonding processes and chip gap height and alignment control for fine-pitch applications (bump pitch <50 μm). It is difficult to achieve a high degree of x, y, z, and theta placement accuracy with the existing thermocompression bonding tool designs due to the large form factor for panel-level tools (>500×500 mm), the elevated process temperatures (>300°) C., fast heating/cooling rate (>100 C/s), and material properties limitations (e.g., non-zero coefficient of thermal expansion (CTE), non-zero thermal conductivity, finite stiffness, etc.).

The present disclosure is directed to a thermocompression bonding tool having a bond head with a surface for compression and heating and a sensor, a stage for compression and heating, a camera for alignment, and a controller. In addition, the stage has local stiffness variations. For chip gap height control, the controller is provided with a recipe displacement and temperature profile (e.g., formulated temperatures and z-inputs for the units under bonding), as well as offsets based on movements of the unit and the stage during the bonding process. For alignment control, the controller is provided with a recipe displacement and temperature profile (e.g., formulated temperatures and z-inputs for the units under bonding), as well as offsets based on alignment measurements during the pre-production bonding test process.

In another aspect, the present disclosure is directed to a method providing a thermocompression bonding tool having a bond head, a stage, and a controller and performing a pre-production bonding test process using the thermocompression bonding tool, including obtaining measurements for offsets as inputs to the controller for chip gap height and alignment control in x, y and theta directions. In addition, the controller applies the offsets to a recipe displacement and temperature profile for production units undergoing a bonding process using the thermocompression bonding tool.

In yet another aspect, the present disclosure is directed to a method providing a thermocompression bonding tool with a bond head, a stage, a camera, and a controller and providing a plurality of units to undergo a production bonding process. Each of the plurality of units is positioned on the stage and the bonding process on the unit may be performed using the thermocompression bonding tool. The controller uses inputs, including a recipe displacement and temperature profile, and unit and tool-related offsets for controlling the bonding process and obtaining a corrected movement of the bond head to obtain a desired chip gap height and alignment for the unit.

The technical advantages of the present disclosure include, but are not limited to:

(i) Providing thermal expansion compensation that considers both tool expansion and package expansion;

(ii) Providing mechanical compensation for a stage's z-direction stiffness at different stage x- and y-locations; and (iii) Providing mechanical placement offset in x,y and theta at different stage x- and y-locations.

To more readily understand and put into practical effect the present thermocompression bonding tool with chip gap height control, which may be used for panel-level manufacturing to improve yield and performance, particular aspects will now be described by way of examples provided in the drawings that are not intended as limitations. The advantages and features of the aspects herein disclosed will be apparent through reference to the following descriptions relating to the accompanying drawings. Furthermore, it is to be understood that the features of the various aspects described herein are not mutually exclusive and can exist in various combinations and permutations. For the sake of brevity, duplicate descriptions of features and properties may be omitted.

In FIG. 1, an exemplary representation of a thermocompression bonding tool 100 is shown according to an aspect of the present disclosure. The thermocompression bonding tool 100 may have a bonding module 101 with a bond head 102, which has a heating and compression surface 102*a*, which provides a downward compressive force to enable the thermocompression bonding, and a stage or pedestal 103, which provides a rigid and fixed or movable surface, for receiving and supporting a unit 110 during the bonding process. The bond head 102 may be movable and also have a sensor 106, which may be used to measure, for example, z-direction movement and a force response from a semiconductor package 109*a*. The stage 103 may also be heated to facilitate the thermocompression bonding.

In an aspect, a transport/conveyer system 104 may be used to move the unit 110 from a storage rack (not shown) onto the stage 103. Alternatively, in another aspect, a handling mechanism (not shown) may be used that lifts the unit 110 onto and off the stage 103.

In addition, the thermocompression bonding tool 100 may have a controller 105 that is coupled to the bond head and stage. The controller 105 may be used to obtain a displacement of the bond head that results in a desired chip gap height for the unit 110. In an aspect, the thermocompression tool may have a camera 108 to provide alignment measurements as inputs to the controller 105.

It is understood that a typical thermocompression bonding temperature profile may have several segments or cycles, including heating, dwelling, and cooling. Throughout the bonding process, both the thermocompression bonding tool and the semiconductor packages undergoing the bonding operation are experiencing expansions and contractions, which need to be accounted for if the desired chip gap height is to be attained.

As shown in FIG. 1A, the semiconductor package 109*a* with solder balls or paste 107*a* may be bonded to semiconductor panel 109*b* with solder flux or paste 107*b*. In an aspect, the proper alignment of the semiconductor packages 109*a* on the panel 109*b* may be maintained with the proper alignment of the solder balls 107*a* with the solder flux 107*b* as discussed below.

In an aspect, the controller 105 may be provided with the inputs needed to achieve a desired chip gap height for the unit 110, including a "recipe displacement and temperature profile" that provides formulated temperatures and displacements generated during the setup of the thermocompression bonding process, and/or based on conventional settings and technical know-how, that may be specific for a particular bonding operation to be performed. According to the present disclosure, the controller 105 may be provided with additional inputs, including a first offset based on pre-production alignment measurements in the x, y and theta directions and a second offset based on pre-production measurements of the z-direction movements of the unit and the stage during the bonding process.

It should be understood that the present unit 110 may have a square or rectangular shape panel having a size of 500×500 mm or greater. It should be understood that a present thermocompression bonding tool will be configured with a bond head and a stage having form factors that permit the thermocompression bonding of such panels. In an aspect, the unit 110 may have a plurality of semiconductor packages 109*a* positioned on the panel 109*b*.

Figures 2, 2A, 2B:
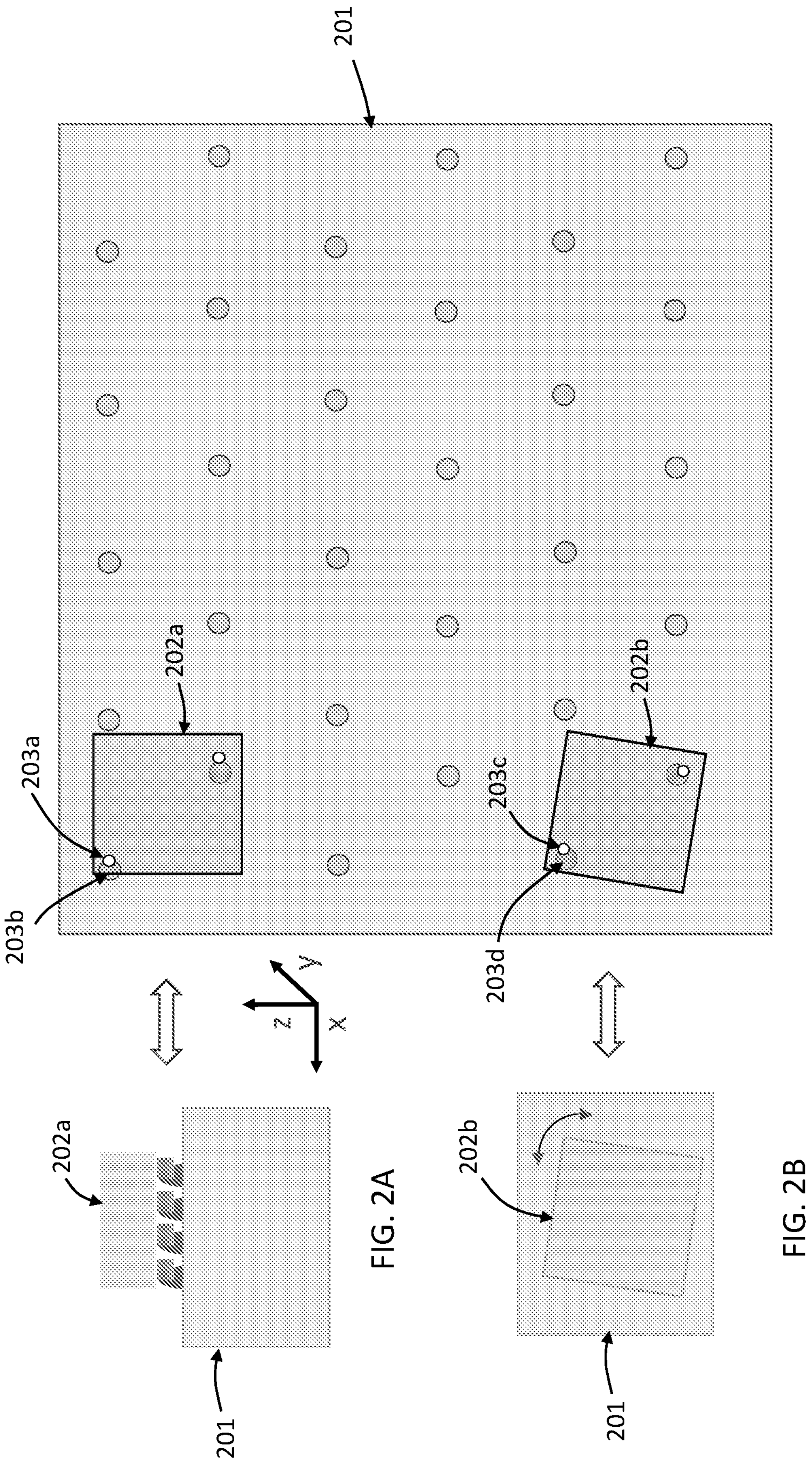
FIGS. 2, 2A, and 2B show exemplary views of an alignment measurement process according to an aspect of the present disclosure.

FIGS. 2, 2A, and 2B show exemplary views of an alignment measurement process according to an aspect of the present disclosure. In an aspect, to improve placement accuracy in the x-direction and y-direction, as well as the rotational position or theta, into consideration, a pre-production test process may include conducting alignment measurements at different stage locations using elevated temperatures to determine offsets that may be provided to a controller for a thermocompression bonding tool. It is possible for the variance in the x-direction and y-direction to be as much as 1 to 2 μm as the bonding location on a panel or stage changes.

In another aspect, a calibration may be performed using a "kit" with two (2) pieces of glass or test components, i.e., a smaller first piece may be a glass die or a test package, which are shown as 202*a* and 202*b* in FIG. 2, and a larger second piece may be a glass substrate or a test panel, which is shown as 201 in FIG. 2, and are marked with concentric fiducial markers 203*a* and 203*c*, respectively, on the test package 202*a* and 202*b* and fiducial marker 203*b* and 203*d* on the test panel 201.

In an aspect, during the alignment test process or calibration, a glass die may be picked up by the bond head and a glass substrate may be held on the bond stage. A camera system (not shown) may be provided to align the fiducial markers of the glass die and glass substrate by a conventional fiducial recognition process. The positions of a bond head and a stage may be moved in the x-direction and y-direction and theta direction to perfectly align the fiducials markers of the glass die and the glass substrate before the bond head is moved downward in a z-direction to simulate a bonding cycle. The alignment data from the camera system may be used to define x-direction and y-direction and theta direction offsets. In FIG. 2A, a misalignment in the x-direction is shown, and in FIG. 2B, a misalignment in the theta direction is shown, this calibration may need to be performed multiple times on a single location to define average alignment offset.

Figure 3:
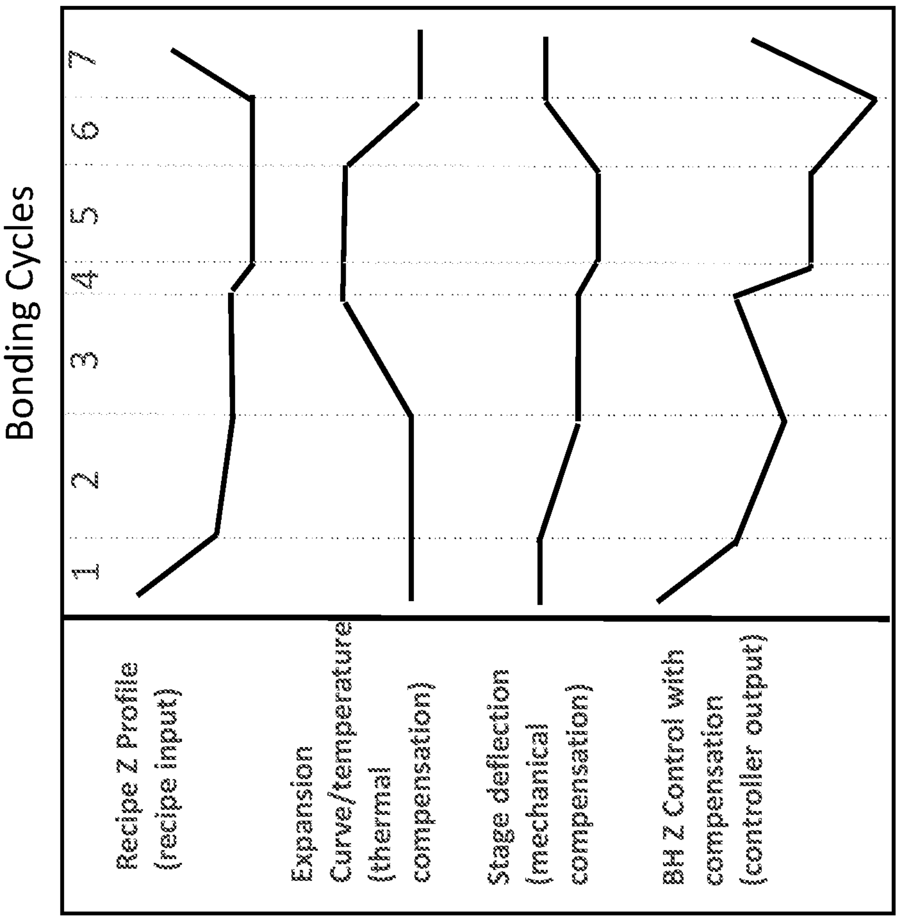
FIG. 3 shows exemplary representative curves for inputs/offsets for chip gap height control according to an aspect of the present disclosure.

In FIG. 3, exemplary representative curves for inputs/offsets for chip gap height control are shown according to an aspect of the present disclosure. In an aspect, a set of thermal expansion and mechanical measurements for a thermocompression bonding tool may be "integrated" into a recipe Z-value profile to provide an accurate chip gap height for a thermocompression bonding process. The chip gap height control may use measurements taken from pre-production bonding testing to obtain temperature and expansion inputs/offsets, as well as stage deflection inputs/offsets.

For a specified thermocompression bonding tool, the chip gap height control may be realized by a high-resolution, high-accuracy z-axis control for the bond head. However, upon contact, the bond head is applying force to the stage to hold the substrates or a panel in place, which may result in the stage being deflected due to its finite stiffness. It is recognized that a stage stiffness curve may be non-linear and may vary from location to location, as well as from tool to tool. In order to compensate for these non-linearities and variations, a stage stiffness curve may need to be measured at different locations. For a pre-production calibration of a stage, it may be necessary to take measurements at selected locations of the stage. During production thermocompression bonding, the chip gap height control will compensate for the stage stiffness using the stage stiffness curve.

In another aspect, to provide accurate chip gap height control, a pre-production bonding test process may be performed to measure an expansion/contraction curve on the top of one or more test units or packages. An expansion curve may be measured by holding a constant force on the test package, applying the process recipe displacement and temperature profile, and measuring the displacement by conventional techniques. During the actual production bonding process, the expansion compensation curve may be included as an offset for a unit along with the recipe z-displacement control profile as inputs to a controller to achieve the desired chip gap height control. It should be noted that the expansion curve may be measured at the package/die level because the package/die's size and thickness can drastically change the thermal path and heat transfer, which may impact the measurements for an expansion curve.

In a further aspect, the z-value control for production manufacturing may be, for example, a superposition of the recipe Z profile curve (z-axis settings), and the offsets generated from the thermal expansion measurement curve, and the stage deflection measurement curve to provide the BH (bond head) Z-control curve, as illustrated in FIG. 3 for bonding cycles 1 through 7, i.e., 1) movement down, 2) movement down with contact, 3) application of heat, 4) solder flow/collapse, 5) pause in movement, 6) cooling/contraction, and 7) disengagement of the bond head.

Figure 4:
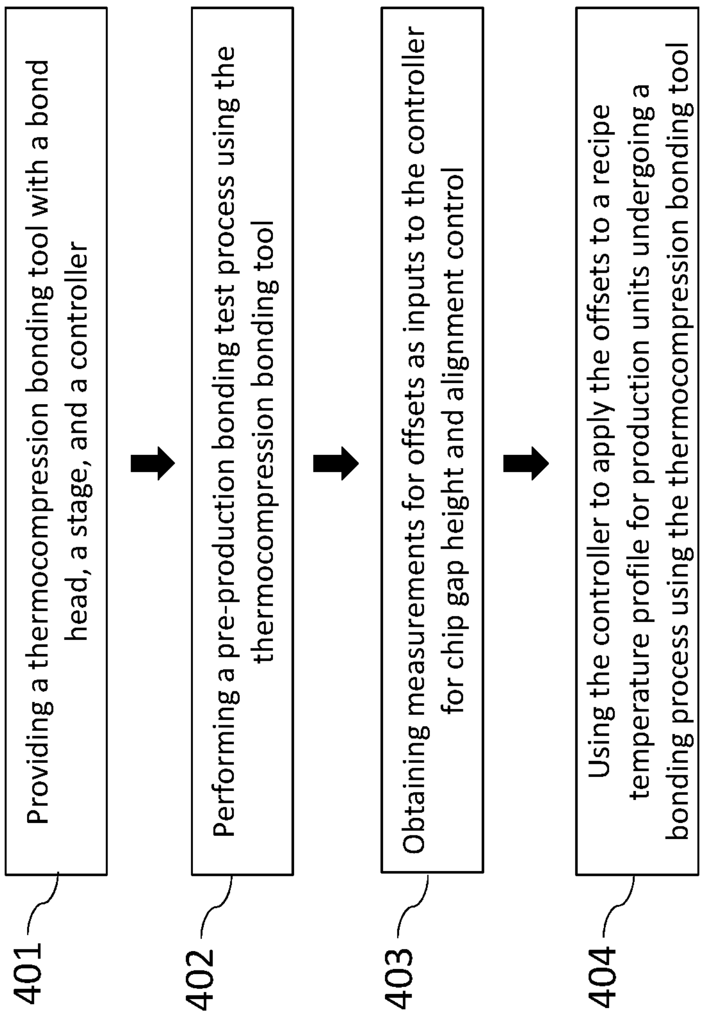
FIG. 4 shows a simplified flow diagram for an exemplary method according to an aspect of the present disclosure.

FIG. 4 shows a simplified flow diagram for an exemplary method according to an aspect of the present disclosure. In an aspect, the present method may be able to provide displacements or offsets for chip gap height control for production panel units. It should be understood that the present method may also be used for thermocompression bonding tools that are intended for wafer-level bonding.

The operation 401 may be directed to providing a thermocompression bonding tool with a bond head, a stage, and a controller.

The operation 402 may be directed to performing a pre-production bonding test process using the thermocompression bonding tool.

The operation 403 may be directed to obtaining measurements for offsets as inputs to the controller for chip gap height and alignment control.

The operation 404 may be directed to using the controller to apply the offsets to a recipe displacement and temperature profile for production units undergoing a bonding process using the thermocompression bonding tool.

Figure 5:
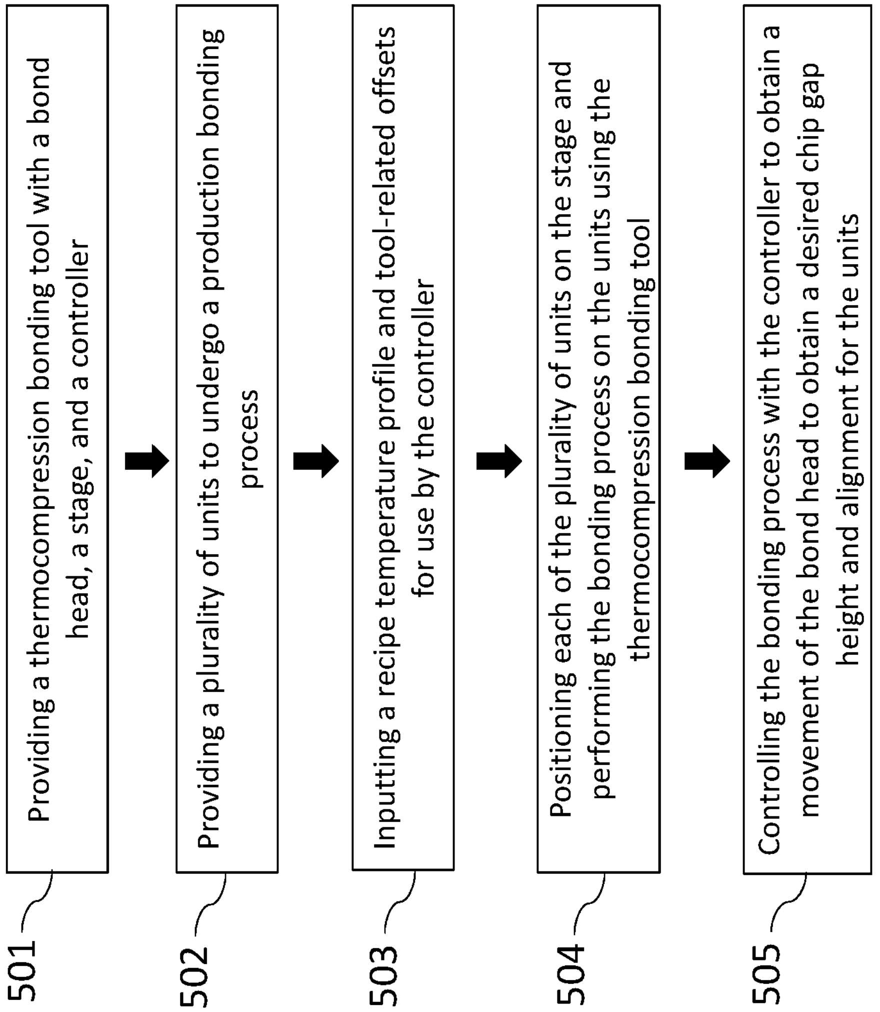
FIG. 5 shows a simplified flow diagram for another exemplary method according to an aspect of the present disclosure.

FIG. 5 shows a simplified flow diagram for another exemplary method according to an aspect of the present disclosure. In an aspect, the present method may be able to provide chip gap height control for production panel units. It should be understood that the present method may also be used for thermocompression bonding tools that are intended for wafer-level bonding.

The operation 501 may be directed to providing a thermocompression bonding tool with a bond head, a stage, and a controller.

The operation 502 may be directed to providing a plurality of units to undergo a production bonding process.

The operation 503 may be directed to inputting a recipe displacement and temperature profile and tool-related offsets for use by the controller.

The operation 504 may be directed to positioning each of the plurality of units on the stage and performing the bonding process on the units using the thermocompression bonding tool.

The operation 505 may be directed to controlling the bonding process with the controller to obtain a movement of the bond head to obtain a desired chip gap height and alignment for the units.

It will be understood that any property described herein for a specific thermocompression bonding tool may also hold for any panel-level manufacturing tool not otherwise described herein. It will also be understood that any property described herein for a specific method may hold for any of the methods described herein. Furthermore, it will be understood that for any thermocompression bonding tool and the methods described herein, not necessarily all the components or operations described will be shown in the accompanying drawings or method, but only some (not all) components or operations may be disclosed.

To more readily understand and put into practical effect the present semiconductor carrier platforms and thermal stability layers, they will now be described by way of examples. For the sake of brevity, duplicate descriptions of features and properties may be omitted.

EXAMPLES

Example 1 provides a thermocompression bonding tool including a bond head with a compression and heating surface and a sensor, for which the sensor provides thermal and mechanical inputs for a unit undergoing a bonding process, a stage, for which the stage has local stiffness variations, a camera, for which the camera provides alignment measurements for the unit undergoing the bonding process, and a controller coupled to the bond head and the stage, for which the controller is provided with a first offset based on the alignment measurements and a second offset based on movements of the unit and the stage during the bonding process.

Example 2 may include the thermocompression bonding tool of example 1 and/or any other example disclosed herein, for which the controller is provided with a recipe displacement and temperature profile including formulated temperatures and z-inputs for the unit.

Example 3 may include the thermocompression bonding tool of example 1 and/or any other example disclosed herein, for which the first offset includes x, y, and theta direction measurements at different locations on the stage, and the second offset include z direction measurements at different locations on the stage.

Example 4 may include the thermocompression bonding tool of example 1 and/or any other example disclosed herein, for which the unit includes a plurality of semiconductor packages and a semiconductor panel.

Example 5 may include the thermocompression bonding tool of example 4 and/or any other example disclosed herein, for which the bond head and the stage are configured with form factors for panel-level bonding processes.

Example 6 may include the thermocompression bonding tool of example 5 and/or any other example disclosed herein, for which the panel-level bonding process further includes the plurality of semiconductor packages with attached solder balls being positioned for bonding onto the semiconductor panel with attached solder flux.

Example 7 provides a method that provides a thermocompression bonding tool with a bond head, a stage, and a controller, performing a pre-production bonding test process using the thermocompression bonding tool, and obtaining measurements for inputs for use to generate offsets to provide the controller for chip gap height and alignment control, for which the controller applies the offsets to a recipe displacement and temperature profile for production units undergoing a bonding process using the thermocompression bonding tool.

Example 8 may include the method of example 7 and/or any other example disclosed herein, for which the pre-production bonding test process includes generating a first offset using a camera and a test unit to obtain alignment measurements.

Example 9 may include the method of example 8 and/or any other example disclosed herein, for which the test unit includes a test package with first fiducial markers and a test panel with second fiducial markers, for which the camera uses the first and second fiducial markers to obtain x, y and theta direction alignment measurements at different locations of the stage.

Example 10 may include the method of example 7 and/or any other example disclosed herein, for which the pre-production bonding test process includes generating a second offset using a test unit and a sensor in the bond head to obtain thermal and mechanical measurements.

Example 11 may include the method of example 10 and/or any other example disclosed herein, for which the test unit includes a test package and a test panel and the sensor measures the thermal expansion of the test package and mechanical deflection in a z-direction at different locations of the stage.

Example 12 may include the method of example 7 and/or any other example disclosed herein, further includes configuring the bond head and the stage with form factors for panel-level bonding processes.

Example 13 provides a method providing a thermocompression bonding tool with a bond head, a stage, a camera, and a controller, providing a plurality of units to undergo a production bonding process, inputting a recipe displacement and temperature profile and alignment and displacement offsets for use by the controller, positioning each of the plurality of units on the stage and performing the bonding process on the unit using the thermocompression bonding tool, and controlling the bonding process with the controller to provide movements of the bond head to obtain a desired chip gap height and alignment for the unit.

Example 14 may include the method of example 13 and/or any other example disclosed herein, which further includes configuring the bond head and the stage with form factors for panel-level bonding processes.

Example 15 may include the method of example 14 and/or any other example disclosed herein, for which each of the plurality of units includes a plurality of semiconductor packages and a semiconductor panel, for which the plurality of semiconductor packages are positioned and bonded onto the semiconductor panel.

Example 16 may include the method of example 13 and/or any other example disclosed herein, for which the recipe displacement and temperature profile includes formulated temperatures and movements of the bond head associated with the bonding of the plurality of units with the thermocompression bonding tool.

Example 17 may include the method of example 13 and/or any other example disclosed herein, further includes performing a pre-production bonding test process to generate the alignment offset for the thermocompression bonding tool.

Example 18 may include the method of example 17 and/or any other example disclosed herein, for which generating the alignment offset for the thermocompression bonding tool includes providing a test package with first fiducial markers and a test panel with second fiducial markers, for which the first and second fiducial markers are used by the camera to obtain alignment measurements.

Example 19 may include the method of example 17 and/or any other example disclosed herein, for which the pre-production bonding test process generates the displacement offset for the thermocompression bonding tool.

Example 20 may include the method of example 19 and/or any other example disclosed herein, for which thermal expansion of the test package and mechanical deflection at different locations of the stage are used by the sensor to obtain displacement measurement.

The term “comprising” shall be understood to have a broad meaning similar to the term “including” and will be understood to imply the inclusion of a stated integer or operation or group of integers or operations but not the exclusion of any other integer or operation or group of integers or operations. This definition also applies to variations on the term “comprising” such as “comprise” and “comprises”.

The term “coupled” (or “connected”) herein may be understood as electrically coupled or as mechanically coupled, e.g., attached or fixed or attached, or just in contact without any fixation, and it will be understood that both direct coupling or indirect coupling (in other words: coupling without direct contact) may be provided.

The terms “and” and “or” herein may be understood to mean “and/or” as including either or both of two stated possibilities.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. A method comprising:

providing a thermocompression bonding tool with a bond head, a stage, and a controller;

performing a pre-production bonding test process using the thermocompression bonding tool; and obtaining from the pre-production bonding test measurements for inputs for use to generate offsets to provide the controller for chip gap height and alignment control, modifying a recipe displacement and temperature profile that includes temperatures and movements of the bond head associated with the bonding of the plurality of units with the thermocompression bonding tool, wherein the modifying the recipe displacement and temperate profile comprises the controller applying the offsets to the recipe displacement and temperature profile for production units undergoing a bonding process using the thermocompression bonding tool.

2. The method of claim 1, wherein the pre-production bonding test process comprises generating a first offset using a camera and a test unit to obtain alignment measurements.

3. The method of claim 2, wherein the test unit comprises a test package with first fiducial markers and a test panel with second fiducial markers, wherein the camera uses the first and second fiducial markers to obtain x, y, and theta direction alignment measurements at different locations of the stage.

4. The method of claim 1, wherein the pre-production bonding test process comprises generating a second offset using a test unit and a sensor in the bond head to obtain thermal and mechanical measurements.

5. The method of claim 1, wherein the test unit comprises a test package and a test panel, and the sensor measures a thermal expansion of the test package and mechanical deflection in a z-direction at different locations of the stage.

6. The method of claim 1, further comprises configuring the bond head and the stage with form factors for panel-level bonding processes.

7. A method comprising:

providing a thermocompression bonding tool with a bond head, a stage, a camera, and a controller;

providing a plurality of units to undergo a production bonding process;

performing a pre-production bonding test process to generate an alignment or displacement offset for a thermocompression bonding tool;

modifying a recipe displacement and temperature profile by the alignment or displacement offset;

inputting the modified recipe displacement and temperature profile for use by the controller;

positioning each of the plurality of units on the stage and performing the bonding process on the unit using the thermocompression bonding tool; and controlling the bonding process with the controller to provide movements of the bond head to obtain a desired chip gap height and alignment for the unit;

wherein the recipe displacement and temperature profile comprises temperatures and movements of the bond head associated with a bonding of the plurality of units with the thermocompression bonding tool.

8. The method of claim 7, further comprises configuring the bond head and the stage with form factors for panel-level bonding processes.

9. The method of claim 8, wherein each of the plurality of units comprises a plurality of semiconductor packages and a semiconductor panel, wherein the plurality of semiconductor packages are positioned and bonded onto the semiconductor panel.

10. The method of claim 7, wherein generating the alignment offset for the thermocompression bonding tool comprises:

providing a test package with first fiducial markers and a test panel with second fiducial markers, wherein the first and second fiducial markers are used by the camera to obtain alignment measurements.

11. The method of claim 7, wherein the pre-production bonding test process to generate the displacement offset for the thermocompression bonding tool.

12. The method of claim 11, wherein generating the displacement offset comprises providing a test package and a test panel, wherein thermal expansion of the test package and mechanical deflection at different locations of the stage are used by a sensor to obtain displacement measurement.

* * * * *